United States Patent
Lin et al.

(10) Patent No.: US 10,002,716 B1
(45) Date of Patent: Jun. 19, 2018

(54) ELECTRON TRANSPORT STRUCTURE AND PEROVSKITE SOLAR CELL HAVING THE SAME

(71) Applicant: National Tsing Hua University, Hsinchu (TW)

(72) Inventors: Hao-Wu Lin, Hsinchu (TW); Wei-Hung Lee, Hsinchu (TW); Sheng-Yi Hsiao, Hsinchu (TW)

(73) Assignee: National Tsing Hua University (TW)

( * ) Notice: Subject to any disclaimer, the term of this patent is extended or adjusted under 35 U.S.C. 154(b) by 0 days. days.

(21) Appl. No.: 15/606,032

(22) Filed: May 26, 2017

(30) Foreign Application Priority Data

Mar. 22, 2017 (TW) .............................. 106109487 A

(51) Int. Cl.
   *H01L 51/42*  (2006.01)
   *H01G 9/20*  (2006.01)
   *H01L 51/44*  (2006.01)
   *H01L 51/00*  (2006.01)

(52) U.S. Cl.
   CPC .......... *H01G 9/2018* (2013.01); *H01G 9/2009* (2013.01); *H01L 51/005* (2013.01); *H01L 51/008* (2013.01); *H01L 51/0046* (2013.01); *H01L 51/0061* (2013.01); *H01L 51/0067* (2013.01); *H01L 51/4273* (2013.01); *H01L 51/441* (2013.01); *H01L 51/0068* (2013.01); *H01L 2251/301* (2013.01); *H01L 2251/303* (2013.01)

(58) Field of Classification Search
   CPC ................ H01G 9/2018; H01G 9/2009; H01L 51/0046; H01L 51/005; H01L 51/0061; H01L 51/0067; H01L 51/008; H01L 51/4273; H01L 51/441
   USPC ........................................................ 136/256
   See application file for complete search history.

(56) References Cited

U.S. PATENT DOCUMENTS

2017/0125747 A1* 5/2017 Lee ........................ C09K 11/06

* cited by examiner

*Primary Examiner* — Jayne L Mershon

(57) ABSTRACT

Differing from conventional technology utilizing double-layer electron transport layer (ETL) to improving power conversion efficiency of perovskite solar cell, the present invention discloses a novel electron transport structure comprising an interfacial diploe moment enhancing layer, an electron transport layer and an interfacial layer. After applying this electron transport structure in a perovskite solar cell, it is found that an interfacial dipole moment formed between the electron transport layer of the electron transport structure and an active layer of the perovskite solar cell is amplified, so as to give rise to an enhanced driving force for the separation of photogenerated carriers and accelerating charge extraction. Moreover, a variety of experimental data have proved that, compared with the perovskite solar cell having double-layer ETL, the perovskite solar cell using this novel electron transport structure exhibits understanding performances including short-circuit current, open-circuit voltage, filling factor, and power conversion efficiency.

20 Claims, 9 Drawing Sheets

US 10,002,716 B1

ELECTRON TRANSPORT STRUCTURE AND PEROVSKITE SOLAR CELL HAVING THE SAME

BACKGROUND OF THE INVENTION

1. Field of the Invention

The present invention relates to the technology field of solar cells, and more particularly to an electron transport structure and a perovskite solar cell having the same.

2. Description of the Prior Art

Wind energy and solar energy are two well-known and different types of renewable energies, wherein solar cell is a conventional electricity generating device capable of converting the solar energy to an electrical power by using specific photovoltaic materials. Solar cell technologies are classified into three generations. First generation solar cells are mainly based on silicon wafers and typically demonstrate high conversion performance about 15-20%. On the other hand, second generation solar cells are based on amorphous silicon and compound semiconductors, such as CIS, CIGS, CdTe, and GaAs.

Third generation solar cells are potentially able to overcome the Shockley-Queisser limit of 31-41% power efficiency for single bandgap solar cells, including dye-sensitized solar cell (DSSC), organic polymer solar cell, organic small molecule solar cells, and organic-inorganic hybrid solar cells. Perovskite solar cell is a representative of the organic-inorganic hybrid solar cell, and can be further divided into mesoporous perovskite solar cell and planar perovskite solar cell. FIG. 1 shows a cross-sectional view of one type of planar organic-inorganic hybrid perovskite solar cell, comprising: an ITO substrate 11', a hole transport layer 12' made of PEDOT:PSS, an active layer 13', an electron transport layer 14' made of PCBM, and a metal layer 15'.

In the planar organic-inorganic hybrid perovskite solar cell 1' of FIG. 1, the ITO substrate 11' consists of a transparent substrate 111' and an indium tin oxide (ITO) layer 112', and the ITO layer 112' and the silver-made metal layer 15' are respectively used as an anode and a cathode. It is worth explaining that, the active layer 13' is made of metal halide perovskite, which is a light-absorbing material and has a cubic lattice structure represented by chemical formula of $ABX_3$. In the chemical formula, A is represented by $CH_3NH_3$, B means Pb or Sn, and X is Cl, Br or I.

Please continuously refer to FIG. 2, which illustrates a cross-sectional view of another type of planar organic-inorganic hybrid perovskite solar cell. The planar organic-inorganic hybrid perovskite solar cell 1a' shown in FIG. 2 is disclosed by Literature 1, which is written by Liu et. al, entitled with "Understanding Interface Engineering for High-Performance Fullerene/Perovskite Planar Heterojunction Solar Cells", and published on Advanced Energy Materials Vol. 6, Issue 2(2016). By comparing FIG. 2 with FIG. 1, it is easy to find that the planar organic-inorganic hybrid perovskite solar cell 1a' further comprise an interlayer 16' disposed between the electron transport layer 14' and the metal layer 15'. Moreover, based on experimental data, Liu indicates that the interlayer 16' made of C60 fullerene is not only helpful for improving the charge accumulation at the surface of the perovskite active layer 13', but also provides a protection to the electron transport layer 14' and the active layer 13'. The most important is that the planar organic-inorganic hybrid perovskite solar cell 1a' exhibits outstanding power conversion efficiency (PCE) and service life time.

In spite of the planar organic-inorganic hybrid perovskite solar cell 1a' exhibiting outstanding power conversion efficiency (PCE) above 15%, there is still room for improvement in the PCE of the planar organic-inorganic hybrid perovskite solar cell 1a' after comparing the planar organic-inorganic hybrid perovskite solar cell 1a' disclosed by Literature 1 with conventional or commercial compound semiconductor solar cells (such as CIGS). Accordingly, in view of the power conversion efficiency of the conventional planar organic-inorganic hybrid perovskite solar cells still needing to be improved and increased, the inventors of the present application have made great efforts to make inventive research thereon and eventually provided an electron transport structure and a perovskite solar cell having the same.

SUMMARY OF THE INVENTION

The primary objective of the present invention is to provide an electron transport structure and a perovskite solar cell having the electron transport structure. Differing from conventional technology utilizing double-layer electron transport layer (ETL) to improving power conversion efficiency of perovskite solar cell, the present invention discloses a novel electron transport structure comprising an interfacial diploe moment enhancing layer, an electron transport layer and an interfacial layer. After applying this electron transport structure in a perovskite solar cell, it is found that an interfacial dipole moment formed between the electron transport layer of the electron transport structure and an active layer of the perovskite solar cell is amplified, so as to give rise to an enhanced driving force for the separation of photogenerated carriers and accelerating charge extraction. Moreover, a variety of experimental data have proved that, compared with the perovskite solar cell having double-layer ETL, the perovskite solar cell using this novel electron transport structure exhibits understanding performances including short-circuit current, open-circuit voltage, filling factor, and power conversion efficiency.

In order to achieve the primary objective of the present invention, the inventor of the present invention provides one embodiment for the electron transport structure applied in a perovskite solar cell, wherein the electron transport structure is disposed between a cathode layer and a perovskite active layer of the perovskite solar cell, and comprising an interfacial dipole moment enhancing layer, being formed on the perovskite active layer, and disposed between the cathode layer and the perovskite active layer;

an electron transport layer, being formed on the interfacial dipole moment enhancing layer, and disposed between the cathode layer and the interfacial dipole moment enhancing layer; and an interfacial layer, being formed on the electron transport layer, and disposed between the cathode layer and the electron transport layer;

wherein the interfacial dipole moment enhancing layer is made of a molecular material, and a chemical structure of the molecular material having at least one nitrogen-containing heterocyclic compound with six-membered ring;

wherein the interfacial dipole moment enhancing layer is used for amplifying an interfacial dipole moment formed between the electron transport layer and the perovskite active layer, so as to enhance the power conversion efficiency of the perovskite solar cell by giving rise to a driving force for the separation of carriers accumulating at the surface of the perovskite active layer.

Moreover, for achieving the primary objective of the present invention, the inventor of the present invention further provides one embodiment for the perovskite solar cell, comprising:

a transparent substrate;
an anode layer, being formed on the transparent substrate;
a hole transport layer, being formed on the anode layer;
an perovskite active layer, being formed on the hole transport layer; and
an electron transport structure, comprising:
  an interfacial dipole moment enhancing layer, being formed on the perovskite active layer, and disposed between the cathode layer and the perovskite active layer;
  an electron transport layer, being formed on the interfacial dipole moment enhancing layer, and disposed between the cathode layer and the interfacial dipole moment enhancing layer; and
  an interfacial layer, being formed on the electron transport layer, and disposed between the cathode layer and the electron transport layer;
wherein the interfacial dipole moment enhancing layer is made of a molecular material, and a chemical structure of the molecular material having at least one nitrogen-containing heterocyclic compound with six-membered ring;
wherein the interfacial dipole moment enhancing layer is used for amplifying an interfacial dipole moment formed between the electron transport layer and the perovskite active layer, so as to enhance the power conversion efficiency of the perovskite solar cell by giving rise to a driving force for the separation of carriers accumulating at the surface of the perovskite active layer.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe an electron transport structure and a perovskite solar cell having the electron transport structure according to the present invention, embodiments of the present invention will be described in detail with reference to the attached drawings hereinafter.

Figure 3:
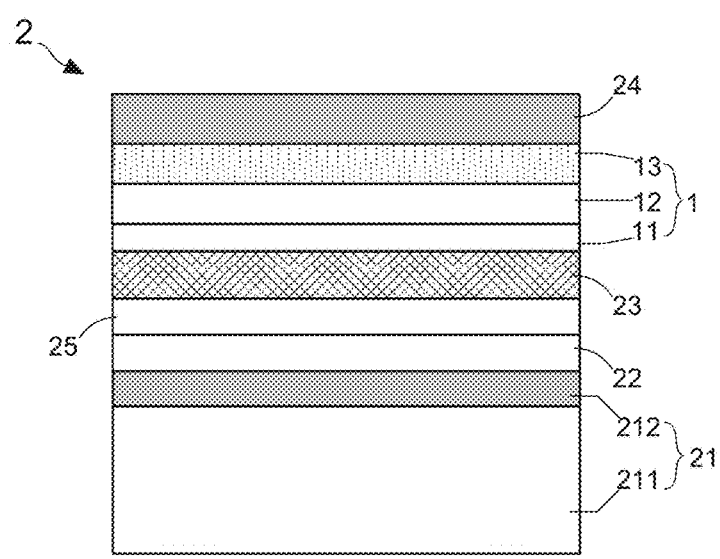
FIG. 3 shows a cross-sectional diagram of a perovskite solar cell having an electron transport structure according to the present invention.

With reference to FIG. 3, there is a cross-sectional diagram of a perovskite solar cell having an electron transport structure according to the present invention. As FIG. 3 shows, the perovskite solar cell 2 of the present invention comprises a transparent conductive substrate 21 constituted by a transparent substrate 211 and an anode 212, a hole transport layer 22, a perovskite active layer 23, a novel electron transport structure 1, and a cathode layer 24.

Figure 1:
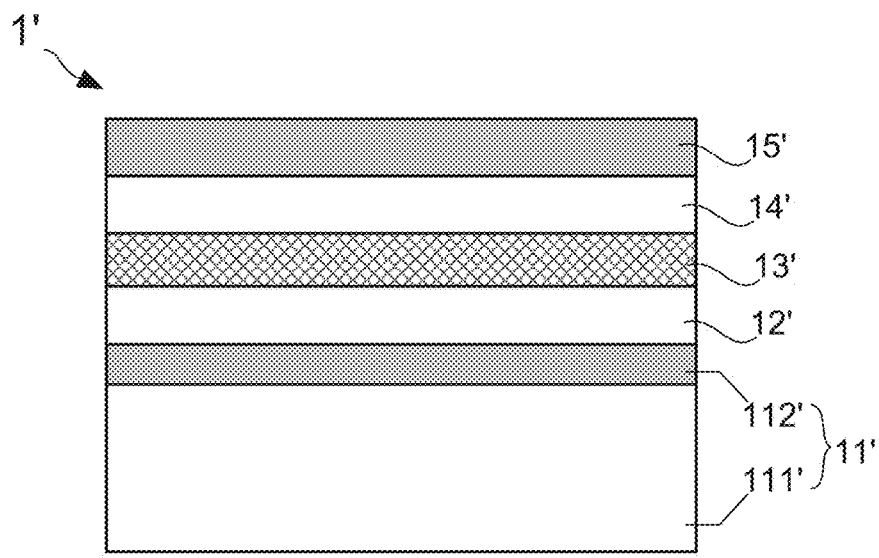
FIG. 1 shows a cross-sectional view of one type of planar organic-inorganic hybrid perovskite solar cell.
Figure 2:
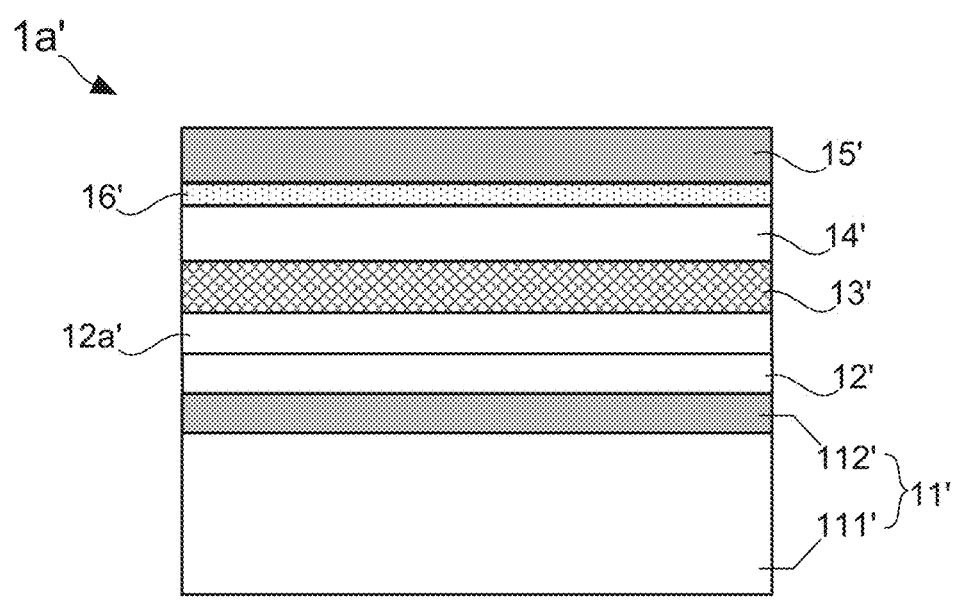
FIG. 2 shows a cross-sectional view of another type of planar organic-inorganic hybrid perovskite solar cell.

According to FIG. 2, it is able to know that Literature 1 discloses a planar organic-inorganic hybrid perovskite solar cell 1a' having a double-layer electron transport structure. However, differing from the disclosure of the double-layer electron transport structure, the novel electron transport structure 1 of FIG. 3 is disposed between the cathode layer 24 and the perovskite active layer 23 of the perovskite solar cell 2, and comprises an interfacial dipole moment enhancing layer 11, an electron transport layer 12, and an interfacial layer 13. Particularly, the interfacial dipole moment enhancing layer 11 has a lowest unoccupied molecular orbital (LUMO) energy level locating between a conduction band minimum (CBM) energy level of the perovskite active layer 23 and a vacuum energy level. Moreover, the interfacial dipole moment enhancing layer 11 is made of a molecular material, wherein a chemical structure of the molecular material has at least one nitrogen-containing heterocyclic compound with six-membered ring. The said nitrogen-containing heterocyclic compound with six-membered ring is a single ring heterocycle containing a specific compound of pyridazine, pyrimidine, pyrazine, or triazine, but not a condensed ring heterocycles including the specific compound.

Figure 4A:
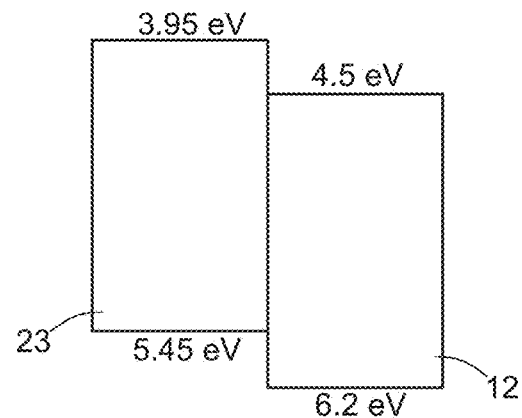
FIG. 4A shows an energy band diagram of a perovskite active layer of the perovskite solar cell and an electron transport layer of the electron transport structure.
Figure 4B:
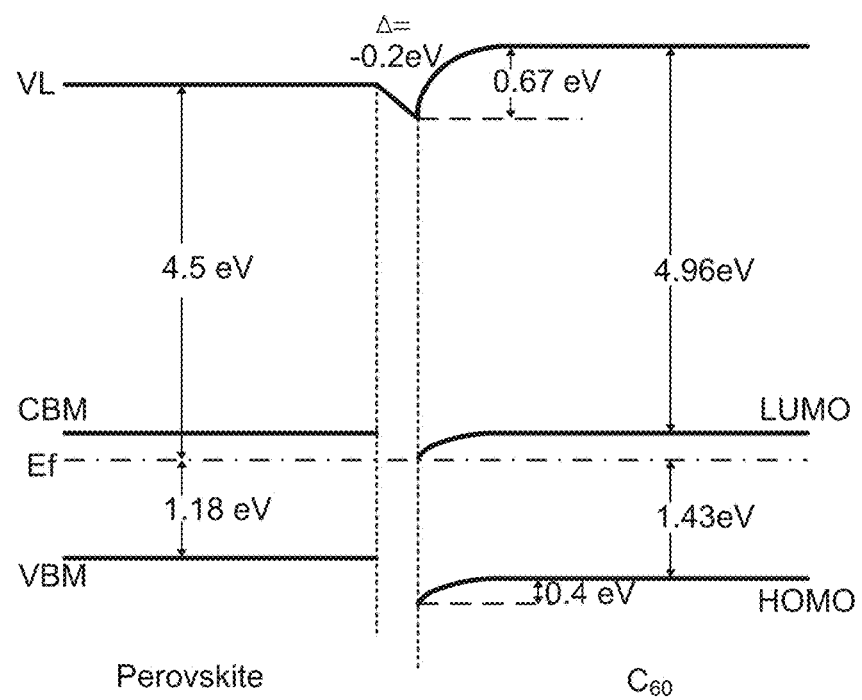
FIG. 4B shows a schematic variation view of interfacial energy levels between the perovskite active layer and the electron transport layer.

Please refer to FIG. 4A and FIG. 4B, wherein FIG. 4A is an energy band diagram of a perovskite active layer of the perovskite solar cell and an electron transport layer of the electron transport structure, and FIG. 4B shows a schematic variation view of interfacial energy levels between the perovskite active layer and the electron transport layer. In FIG. 4A and FIG. 4B, an interfacial dipole moment of −0.2 eV is formed between the electron transport layer 12 and the perovskite active layer 23 as C60 fullerene is adopted as the manufacturing material of the electron transport layer 12. Moreover, explanations or descriptions of the notations or abbreviations marked in FIG. 4B are integrated in following Table (1).

TABLE (1)

| Notation or Abbreviation | Description |
| --- | --- |
| VL | Vacuum level |
| CBM | Conduction band minimum |

TABLE (1)-continued

| Notation or Abbreviation | Description |
| --- | --- |
| VBM | Valence band maximum |
| Ef | Fermi level |

Figure 5A:
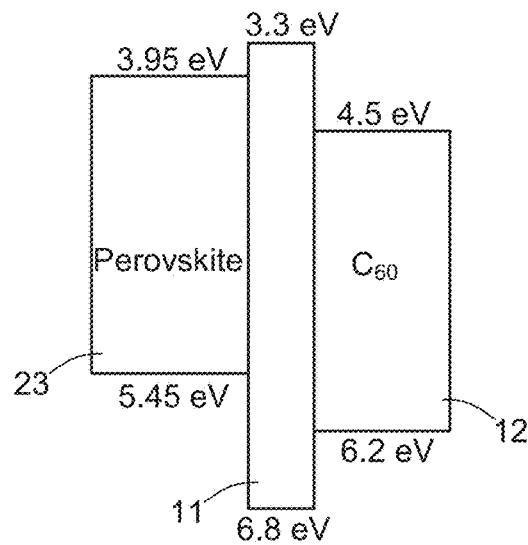
FIG. 5A shows an energy band diagram of the perovskite active layer and the electron transport layer of the electron transport structure.
Figure 5B:
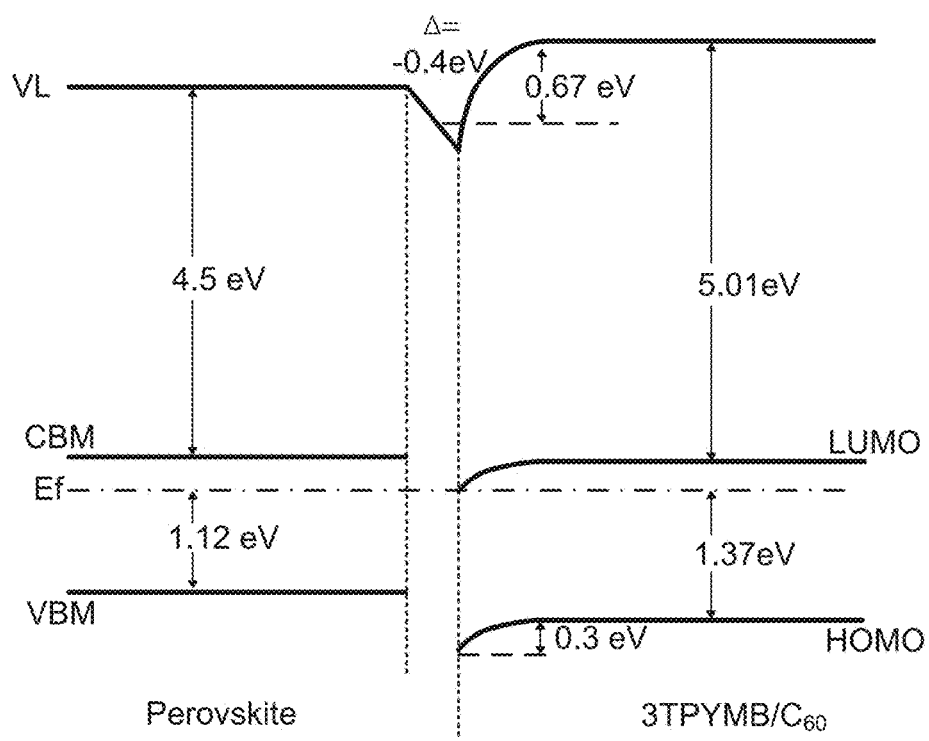
FIG. 5B shows a schematic variation view of interfacial energy levels between the perovskite active layer and the electron transport layer.

Please continuously refer to FIG. 5A and FIG. 5B, wherein FIG. 5A is an energy band diagram of the perovskite active layer, the interfacial dipole moment enhancing layer, and the electron transport layer, and FIG. 5B shows schematic variation view of interfacial energy levels between the perovskite active layer, the interfacial dipole moment enhancing layer and the electron transport layer. By comparing FIG. 4A and FIG. 4B with FIG. 5A and FIG. 5B, it is able to find that the interfacial dipole moment formed between the electron transport layer 12 and the perovskite active layer 23 is amplified from −0.2 eV to −0.4 eV after adding an interfacial dipole moment enhancing layer 11 made of 3TPYMB between the electron transport layer 12 and the perovskite active layer 23.

Thus, FIG. 4B and FIG. 5B have proved that the interfacial dipole moment enhancing layer 11 made of 3TPYMB can indeed be disposed between the electron transport layer 12 and the perovskite active layer 23 for use in amplifying the interfacial dipole moment formed between the electron transport layer 12 and the perovskite active layer 23. Moreover, the amplification of the interfacial dipole moment is helpful for enhancing the power conversion efficiency of the perovskite solar cell 2 by giving rise to a driving force for the separation of carriers accumulating at the surface of the perovskite active layer 23. Herein, it needs to further introduce some exemplary materials suitable for being used as the said interfacial dipole moment enhancing layer 11, which are listed in following Table (2).

TABLE (2)

| Notation or Synonym | Description |
| --- | --- |
| 3TPYMB | Tris(2,4,6-triMethyl-3-(pyridin-3-yl)phenyl)borane |
| B4PyMPM | 4,6-bis(3,5-di(pyridin-4-yl)phenyl)-2-methylpyrimidine |
| TmPyPB | 3,3'-[5'-[3-(3-Pyridinyl)phenyl][1,1':3',1"-terphenyl]-3,3"-dily]bispyridine |
| B3PyPB | 3,5,3",5"-tetra-3-pyridyl-[1,1';3',1']terphenyl |
| TpPyPB | 1,3,5-tri(p-pyrid-3-yl-phenyl)benzene |
| BmPyPhB | 1,3-bis(3,5-dipyrid-3-yl-phenyl)benzene |
| DPPS | Diphenylbis(4-(pyridin-3-yl)phenyl)silane |

It is worth noting that, each of the molecular materials listed by Table (2) have a highest occupied molecular orbital (HOMO) energy level greater than 6.5 eV, and that means the molecular materials used as the interfacial dipole moment enhancing layer 11 also have function to block holes. Therefore, by disposing the interfacial dipole moment enhancing layer 11 between the electron transport layer 12 and the perovskite active layer 23, recombination losses occurring in the perovskite solar cell 2 can be largely reduced by blocking holes from flowing into the electron transport layer 12. On the other hand, as engineers with ordinary skill in developing and manufacturing the planar organic-inorganic hybrid solar cells know, the electron transport layer 12 can be made of C60 fullerene, C70 fullerene, or others fullerene derivatives. Moreover, some exemplary materials for making the electron transport layer 12 are listed in following Table (3).

TABLE (3)

| Notation or Synonym | Description |
| --- | --- |
| PC61BM [PCBM(C61)] | [6,6]-phenyl C61-butyric acid methyl ester |
| PC71BM [PCBM(C71)] | [6,6]-phenyl C71 butyric acid methyl ester |
| PCBB-C8 | [6,6]-phenyl-C61-butyric acid-3,4,5- trisoctyloxy benzyl ester |
| PCBH | [6,6]-phenyl-C61 butyric acid hexyl ester |
| IPH | Indene-C60-propionic acid hexyl ester |
| IPB | Indene-C60-propionic acid butyl ester |

In spite of the manufacturing materials of the interfacial dipole moment enhancing layer 11 and the electron transport layer 12 are listed in Table (2) and Table (3), that does not used for approaching a limitation in use of the manufacturing materials of these two layers. On the other hand, for enhancing the electron extraction rate between the cathode layer 24 and the electron transport layer 12, silver (Ag) is adopted as the manufacturing material of the cathode layer 24 so as to lower the work function of the cathode layer 24. As engineers with ordinary skill in developing and manufacturing the planar organic-inorganic hybrid solar cells known, the manufacturing material of the cathode layer 24 can also be gold (Au), palladium (Pd), nickel (Ni), aluminum (Al), or combination of aforesaid two or more materials. Besides, some exemplary materials for making the interfacial layer 13 are listed in following Table (4).

TABLE (4)

| Notation or Synonym | Description |
| --- | --- |
| TmPyPB | 3,3'-[5'-[3-(3-Pyridinyl)phenyl][1,1':3',1"-terphenyl]-3,3"-diyl]bispyridine |
| B3PyPB | 3,5,3",5"-tetra-3-pyridyl-[1,1';3',1']terphenyl |
| TpPyPB | 1,3,5-tri(p-pyrid-3-yl-phenyl)benzene |
| BmPyPhB | 1,3-bis(3,5-dipyrid-3-yl-phenyl)benzene |
| BCP | Bathocuproin |

In the present invention, particularly, the perovskite active layer 23 has a chemical structure represented by a chemical formula of $ABX_3$, wherein the said A in the chemical formula is selected from the group consisting of $Li^+$, $Na^+$, $Cs^+$, $Rb^+$, and $K^+$. In addition, the said A can also be a compound comprising 1 to 15 carbon atoms and 1 to 20 heteroatoms, wherein the heteroatom is selected from group consisting of N, O, and S. On the other hand, the said B in the chemical formula is selected from the group consisting of $Cu^{2+}$, $Ni^{2+}$, $Co^{2+}$, $Fe^{2+}$, $Mn^{2+}$, $Cr^{2+}$, $Pd^{2+}$, $Gd^{2+}$, $Ge^{2+}$, $Sn^{2+}$, $Pb^{2+}$, $Eu^{2+}$, and $Yb^{2+}$, and the said X in the chemical formula can be $Cl^-$, $Br^-$, $I^-$, $NCS^-$, $CN^-$, or $NCO^-$.

Furthermore, engineers with ordinary skill in developing and manufacturing the planar organic-inorganic hybrid solar cells would also know that the hole transport layer 22 can be made of PEDOT:PSS or $MoO_3$, wherein some exemplary materials for making the hole transport layer 22 are listed in following Table (5).

TABLE (5)

| Notation or Synonym | Description |
| --- | --- |
| $MoO_3$ | Molybdenum oxide |
| spiro-OMeTAD | 2,2',7,7'-tetrakis[N,N-di(4-methoxyphenyl)amino]-9,9'-spirobifluorene |

TABLE (5)-continued

| Notation or Synonym | Description |
|---|---|
| PEDOT:PSS | poly(3,4-ethylenedioxythiophene)-poly(styrenesulfonate) |
| TPD | N,N'-Bis(3-methylphenyl)-N,N'-bis(phenyl)benzidine |
| PTPD | N,N'-diphenyl-N,N'-di-p-tolyl-benzidine |
| P3HT | Poly(3-hexylthiophene-2,5-diyl) |

It is worth explaining that, the perovskite solar cell 2 of FIG. 3 further comprises an electron blocking layer 25 formed between the hole transport layer 22 and the perovskite active layer 23. The manufacturing material of the electron blocking layer 25 can be made of CuPc or TPTPA, and some exemplary materials for making the electron blocking layer 25 are listed in following Table (6).

TABLE (6)

| Notation Or Synonym | Description |
|---|---|
| TPTPA | tris[4'-(2-thienyl)-4-biphenylyl]amine |
| α-NPD | N, N'-bis(naphthalen-1-yl)-N,N'-bis(phenyl)-2,2-diMe |
| TPD | N,N'-Bis(3-methylphenyl)-N,N'-bis(phenyl)benzidine |
| CuPc | copper phthalocyanine |

First Experiment

Above descriptions have introduced the novel electron transport structure 1 and the specific perovskite solar cell 2 having the electron transport structure 1 clearly and completely. Continuously, inventors of the present invention have finished a first experiment in order to prove that the use of the electron transport structure 1 can indeed increase the power conversion efficiency (PCE) of the perovskite solar cell 2. The first experiment includes an experimental group consisting of three perovskite solar cell 2 of FIG. 3 which respectively using 3TPYMB, B4PyMPM and TmPyPB as their interfacial dipole moment enhancing layer 11. In addition, the first experiment also includes a control group including the conventional planar organic-inorganic hybrid perovskite solar cell 1a' of FIG. 2. Moreover, related materials for making the two solar cell devices are listed in following Table (7).

TABLE (7)

| Layers | Control group | Experimental group |
|---|---|---|
| Hole transport layer | MoO$_3$ (Thickness = 5 nm) | MoO$_3$ (Thickness = 5 nm) |
| Electron blocking layer | TPTPA (Thickness = 10 nm) | TPTPA (Thickness = 10 nm) |
| Perovskite active layer | CH$_3$NH$_3$PbI$_3$ (Thickness = 370 nm) | CH$_3$NH$_3$PbI$_3$ (Thickness = 370 nm) |
| Interfacial dipole moment enhancing layer | — | 3TPYMB, B4PyMPM, or TmPyPB (Thickness = 0.5 nm) |
| Electron transport layer | C60 fullerene (Thickness = 90 nm) | C60 fullerene (Thickness = 90 nm) |
| Interfacial layer | TmPyPB (Thickness = 7 nm) | TmPyPB (Thickness = 7 nm) |
| Cathode layer | Silver (Ag) (Thickness = 150 nm) | Silver (Ag) (Thickness = 150 nm) |

In spite of the materials and their thickness for making the two solar cell devices are clearly listed in Table (7), that does not used for approaching a limitation in manufacturing of the perovskite solar cell 2. For example, the electron transport layer 12 in the perovskite solar cell 2 commonly has a thickness in a range from 30 nm to 300 nm; moreover, the thickness of the interfacial layer 13 is controlled between 5 nm and 15 nm.

Figure 6:
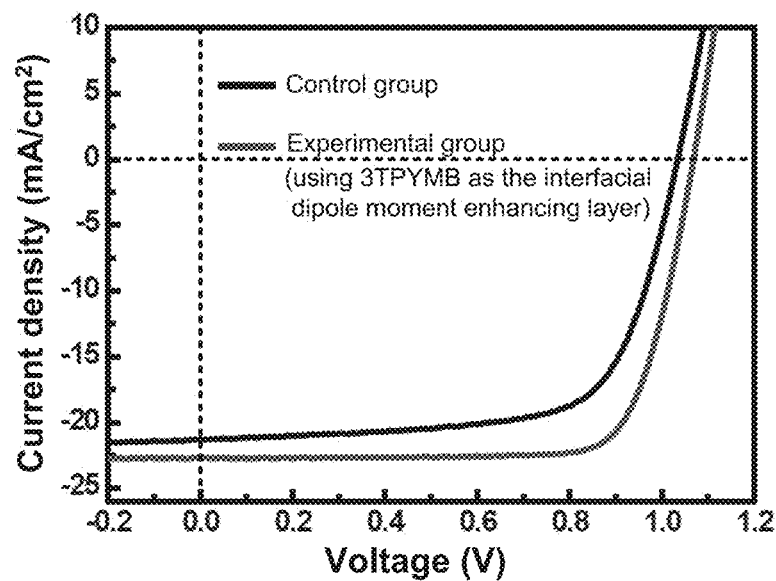
FIG. 6 shows a data curve graph of voltage versus current density.
Figure 7:
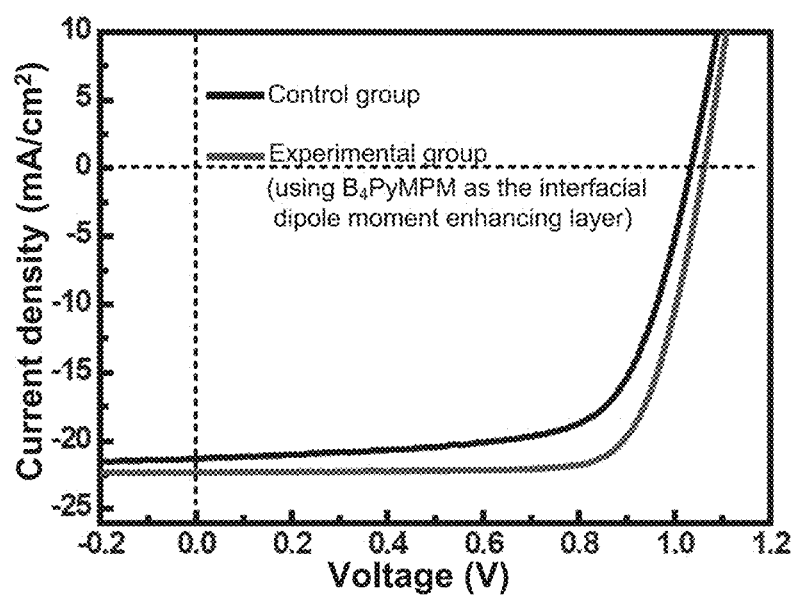
FIG. 7 shows a data curve graph of voltage versus current density.
Figure 8:
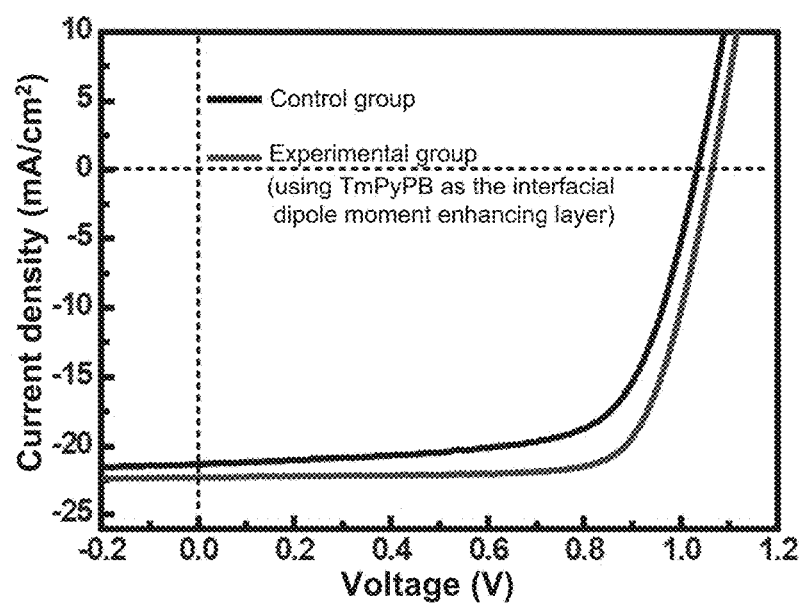
FIG. 8 shows a data curve graph of voltage versus current density.

FIG. 6, FIG. 7 and FIG. 8 provide different data curve graphs of voltage versus current density, wherein experimental data obtained from the data curves are integrated in following Table (8), including short-circuit current ($J_{SC}$), open-circuit voltage ($V_{OC}$), filling factor (FF), and power conversion efficiency (PCE).

TABLE (8)

| Groups | $J_{SC}$ (mA/cm$_2$) | $V_{OC}$ (V) | FF (%) | PCE (%) |
|---|---|---|---|---|
| Control group | 21.31 | 1.04 | 0.682 | 15.1 |
| Experimental group (using 3TPYMB as the interfacial dipole moment enhancing layer) | 22.71 | 1.07 | 0.774 | 18.8 |
| Experimental group (using B4PyMPM as the interfacial dipole moment enhancing layer) | 22.33 | 1.06 | 0.763 | 18 |
| Experimental group (using TmPyPB as the interfacial dipole moment enhancing layer) | 22.28 | 1.06 | 0.750 | 17.7 |

As a result, experimental data including data curve graphs of FIG. 6, FIG. 7 and FIG. 8 as well as Table (8) have proved that, compared with the conventional planar organic-inorganic hybrid perovskite solar cell 1a' of FIG. 2, the perovskite solar cell 2 using the novel electron transport structure 1 exhibits understanding performances including $J_{SC}$, $V_{OC}$, FF, and PCE.

Second Experiment

According to above introductions and descriptions about the electron transport structure 1 and the perovskite solar cell 2, it is known that the interfacial dipole moment enhancing layer 11 is made of a molecular material comprising at least one nitrogen-containing heterocyclic compound with six-membered ring, and the said nitrogen-containing heterocyclic compound with six-membered ring is a single ring heterocycle containing a specific compound of pyridazine, pyrimidine, pyrazine, or triazine, but not a condensed ring heterocycles including the specific compound. Thus, for proving that only the molecular material comprising the single ring heterocycle containing pyridazine, pyrimidine, pyrazine, or triazine can be used as the interfacial dipole moment enhancing layer 11, the inventors of the present invention further finished a second experiment. In second experiment, the control group includes one perovskite solar cell 2 of FIG. 3 using 3TPYMB as the interfacial dipole moment enhancing layer 11, and the experimental group consists of two perovskite solar cells 2 which respectively using NTCDA and Bphen as their interfacial dipole moment enhancing layer 11. Related materials for making the three solar cell devices can refer to above Table (8) and following Table (9).

TABLE (9)

|  | Control group | Experimental group |
|---|---|---|
| interfacial dipole moment enhancing layer | 3TPYMB | NTCDA Bphen |

Figure 9:
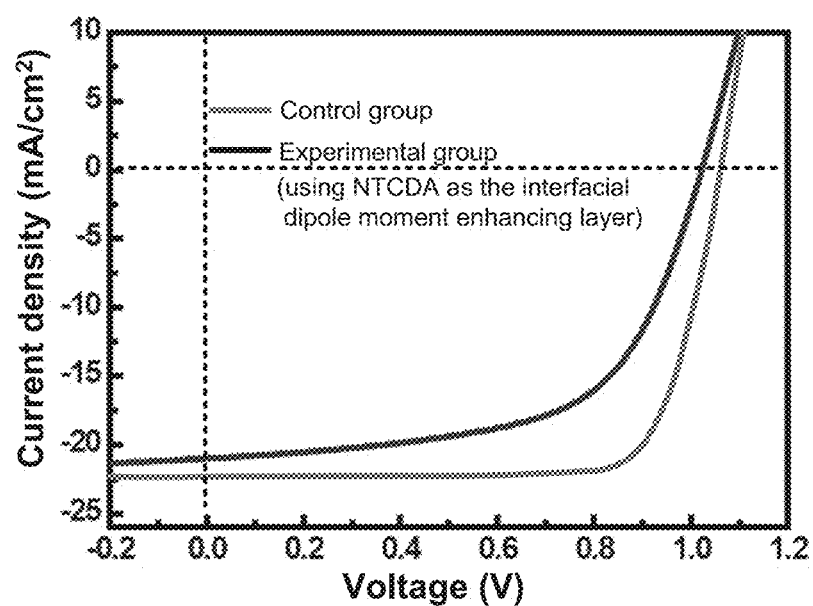
FIG. 9 shows a data curve graph of voltage versus current density.
Figure 10:
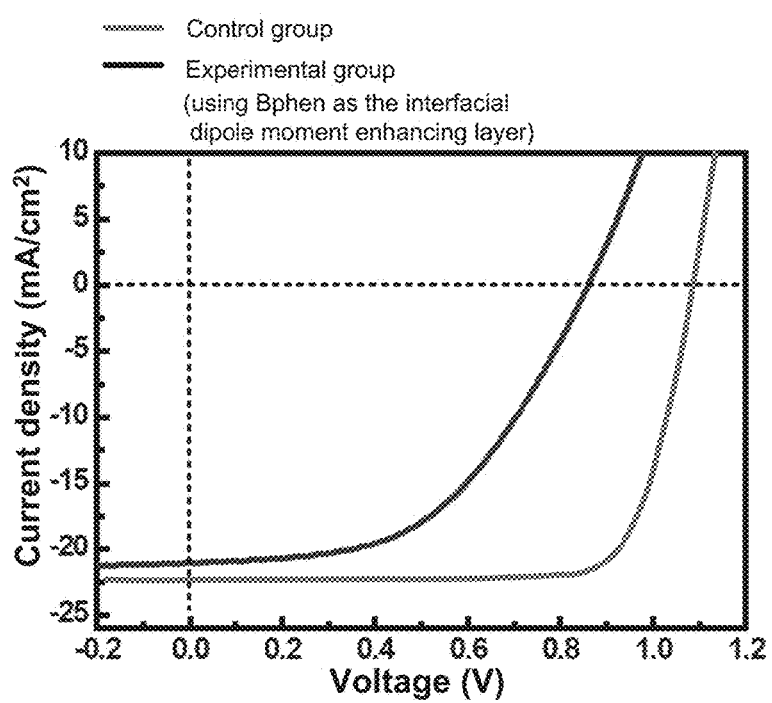
FIG. 10 shows a data curve graph of voltage versus current density.

FIG. 6, FIG. 9 and FIG. 10 provide different data curve graphs of voltage versus current density, wherein experimental data obtained from the data curves are integrated in following Table (10), including short-circuit current ($J_{SC}$), open-circuit voltage ($V_{OC}$), filling factor (FF), and power conversion efficiency (PCE). Therefore, experimental data including data curve graphs of FIG. 6, FIG. 9 and FIG. 10 as well as Table (10) have proved that, only the molecular materials comprising the single ring heterocycle containing pyridazine, pyrimidine, pyrazine, or triazine are suitable for being used as the interfacial dipole moment enhancing layer 11.

TABLE (10)

| Groups | $J_{SC}$ (mA/cm$_2$) | $V_{OC}$ (V) | FF (%) | PCE (%) |
|---|---|---|---|---|
| Control group (using 3TPYMB as the interfacial dipole moment enhancing layer) | 22.71 | 1.07 | 0.774 | 18.8 |
| Experimental group (using NTCDA as the interfacial dipole moment enhancing layer) | 21.35 | 1.02 | 0.601 | 13.1 |
| Experimental group (using Bphen as the interfacial dipole moment enhancing layer) | 21.448 | 0.86 | 0.505 | 9.3 |

Third Experiment

Above introductions and descriptions about the electron transport structure 1 and the perovskite solar cell 2 also indicate that the thickness of the interfacial dipole moment enhancing layer 11 must be controlled between 0.1 nm and 30 nm. For verifying the thickness scope of the interfacial dipole moment enhancing layer 11, the inventors of the present invention have finished a third experiment. Moreover, in third experiment, factors or parameters used in efficiency determination of a solar cell have measured from different perovskite solar cell devices 2 which respectively using 3TPYMB, B4PyMPM and TmPyPB as their interfacial dipole moment enhancing layer 11 with different thickness. Related experimental data have shown by following Table (11).

TABLE (11)

| solar cell devices | $J_{SC}$ (mA/cm$_2$) | $V_{OC}$ (V) | FF (%) | PCE (%) |
|---|---|---|---|---|
| Conventional planar organic-inorganic hybrid perovskite solar cell | 21.31 | 1.04 | 0.682 | 15.1 |
| Perovskite solar cell (using 3TPYMB of 0.5 nm as the interfacial dipole moment enhancing layer) | 22.71 | 1.07 | 0.774 | 18.8 |
| Perovskite solar cell (using 3TPYMB of 1.0 nm as the interfacial dipole moment enhancing layer) | 19.8 | 1.06 | 0.701 | 14.7 |
| Perovskite solar cell (using B4PyMPM of 0.5 nm as the interfacial dipole moment enhancing layer) | 22.33 | 1.06 | 0.763 | 18 |
| Perovskite solar cell (using B4PyMPM of 1.0 nm as the interfacial dipole moment enhancing layer) | 19.45 | 1.06 | 0.726 | 15.0 |
| Perovskite solar cell (using TmPyPB of 0.5 nm as the interfacial dipole moment enhancing layer) | 22.28 | 1.06 | 0.750 | 17.7 |
| Perovskite solar cell (using TmPyPB of 1.0 nm as the interfacial dipole moment enhancing layer) | 21.7 | 1.05 | 0.741 | 16.9 |

Experimental data of Table (11) reveal that, compared with the conventional planar organic-inorganic hybrid perovskite solar cell 1a' of FIG. 2, the perovskite solar cell 2 having the novel electron transport structure 1 exhibits understanding performances as the thickness of the interfacial dipole moment enhancing layer 11 is in a range between 0.1 nm and 0.9 nm. However, under the condition of the thickness of the interfacial dipole moment enhancing layer 11 is thicker than 1.0 nm, the power conversion efficiency (PCE) of the perovskite solar cell 2 is lowers than the conventional planar organic-inorganic hybrid perovskite solar cell's.

Therefore, through above descriptions, an electron transport structure and a perovskite solar cell having the electron transport structure proposed by the present invention has been introduced completely and clearly; in summary, the present invention includes the advantages of:

(1) Differing from conventional technology utilizing double-layer electron transport layer (ETL) to improving power conversion efficiency of perovskite solar cell, the present invention discloses a novel electron transport structure comprising an interfacial diploe moment enhancing layer, an electron transport layer and an interfacial layer. After applying this electron transport structure in a perovskite solar cell, it is found that an interfacial dipole moment formed between the electron transport layer of the electron transport structure and an active layer of the perovskite solar cell is amplified, so as to give rise to an enhanced driving force for the separation of photogenerated carriers and accelerating charge extraction. Moreover, a variety of experimental data have proved that, compared with the perovskite solar cell having double-layer ETL, the perovskite solar cell using this novel electron transport structure exhibits understanding performances including short-circuit current, open-circuit voltage, filling factor, and power conversion efficiency.

The above description is made on embodiments of the present invention. However, the embodiments are not intended to limit scope of the present invention, and all equivalent implementations or alterations within the spirit of the present invention still fall within the scope of the present invention.

What is claimed is:
1. An electron transport structure for use in a perovskite solar cell, wherein the electron transport structure is disposed between a cathode layer and a perovskite active layer of the perovskite solar cell, and comprising:

an interfacial dipole moment enhancing layer, being formed on the perovskite active layer, and disposed between the cathode layer and the perovskite active layer;

an electron transport layer, being formed on the interfacial dipole moment enhancing layer, and disposed between the cathode layer and the interfacial dipole moment enhancing layer; and an interfacial layer, being formed on the electron transport layer, and disposed between the cathode layer and the electron transport layer;

wherein the interfacial dipole moment enhancing layer is made of a molecular material, and a chemical structure of the molecular material having at least one nitrogen-containing heterocyclic compound with six-membered ring;

wherein the interfacial dipole moment enhancing layer is used for amplifying an interfacial dipole moment formed between the electron transport layer and the perovskite active layer, so as to enhance the power conversion efficiency of the perovskite solar cell by giving rise to a driving force for the separation of carriers accumulating at the surface of the perovskite active layer.

2. The electron transport structure of claim 1, wherein the interfacial dipole moment enhancing layer has a lowest unoccupied molecular orbital (LUMO) energy level locating between a conduction band minimum (CBM) energy level of the perovskite active layer and a vacuum energy level.

3. The electron transport structure of claim 1, wherein the interfacial dipole moment enhancing layer has a thickness in a range between 0.1 nm and 30 nm, and being made of a pyridine derivative, a pyridazine derivative, a pyrimidine derivative, a pyrazine derivative, or a triazine derivative.

4. The electron transport structure of claim 1, wherein the manufacturing material of the electron transport layer is selected from the group consisting of C60 fullerene, C70 fullerene, and fullerene derivative.

5. The electron transport structure of claim 1, wherein the manufacturing material of the interfacial layer is selected from the group consisting of TmPyPB, BmPyPB, TpPyPB, B$_3$PyMPM, and BCP.

6. A perovskite solar cell, comprising:
a transparent conductive substrate;
an anode layer, being formed on the transparent substrate;
a hole transport layer, being formed on the anode layer;
an perovskite active layer, being formed on the hole transport layer; and
an electron transport structure, comprising:
an interfacial dipole moment enhancing layer, being formed on the perovskite active layer, and disposed between the cathode layer and the perovskite active layer;
an electron transport layer, being formed on the interfacial dipole moment enhancing layer, and disposed between the cathode layer and the interfacial dipole moment enhancing layer; and
an interfacial layer, being formed on the electron transport layer, and disposed between the cathode layer and the electron transport layer;
wherein the interfacial dipole moment enhancing layer is made of a molecular material, and a chemical structure of the molecular material having at least one nitrogen-containing heterocyclic compound with six-membered ring;

wherein the interfacial dipole moment enhancing layer is used for amplifying an interfacial dipole moment formed between the electron transport layer and the perovskite active layer, so as to enhance the power conversion efficiency of the perovskite solar cell by giving rise to a driving force for the separation of carriers accumulating at the surface of the perovskite active layer.

7. The perovskite solar cell of claim 6, wherein the interfacial dipole moment enhancing layer has a lowest unoccupied molecular orbital (LUMO) energy level locating between a conduction band minimum (CBM) energy level of the perovskite active layer and a vacuum energy level.

8. The perovskite solar cell of claim 6, wherein the interfacial dipole moment enhancing layer has a thickness in a range between 0.1 nm and 30 nm, and being made of a pyridine derivative, a pyridazine derivative, a pyrimidine derivative, a pyrazine derivative, or a triazine derivative.

9. The perovskite solar cell of claim 6, wherein the manufacturing material of the electron transport layer is selected from the group consisting of C60 fullerene, C70 fullerene, and fullerene derivative.

10. The perovskite solar cell of claim 6, wherein the manufacturing material of the interfacial layer is selected from the group consisting of TmPyPB, BmPyPB, TpPyPB, B$_3$PyMPM, and BCP.

11. The perovskite solar cell of claim 6, wherein the manufacturing material of the hole transport layer is selected from the group consisting of MoO$_3$, spiro-OMeTAD, PEDOT:PSS, TPD, PTPD, and P3HT.

12. The perovskite solar cell of claim 6, wherein the manufacturing material of the anode layer is selected from the group consisting of fluorine doped tin oxide (FTO), indium tin oxide (ITO), zinc oxide (ZnO), gallium oxide-doped zinc oxide (ZnO—Ga$_2$O$_3$), and aluminum oxide-doped zinc oxide (ZnO—Al$_2$O$_3$).

13. The perovskite solar cell of claim 6, wherein the manufacturing material of the cathode layer is selected from the group consisting of gold, silver, palladium, nickel, aluminum, combination of aforesaid two or more materials.

14. The perovskite solar cell of claim 6, wherein the perovskite active layer has a chemical structure represented by a chemical formula of ABX$_3$.

15. The perovskite solar cell of claim 6, wherein further comprising an electron blocking layer formed between the electron transport layer and the perovskite active layer.

16. The perovskite solar cell of claim 14, wherein the said A in the chemical formula is selected from the group consisting of Li$^+$, Na$^+$, Cs$^+$, Rb$^+$, and K$^+$.

17. The perovskite solar cell of claim 14, wherein the said A in the chemical formula comprising 1 to 15 carbon atoms and 1 to 20 heteroatoms, and the said heteroatom is selected from group consisting of N, O, and S.

18. The perovskite solar cell of claim 14, wherein the said B in the chemical formula is selected from the group consisting of Cu$^{2+}$, Ni$^{2+}$, Co$^{2+}$, Fe$^{2+}$, Mn$^{2+}$, Pd$^{2+}$, Gd$^{2+}$, Ge$^{2+}$, Sn$^{2+}$, Pb$^{2+}$, Eu$^{2+}$, and Yb$^{2+}$.

19. The perovskite solar cell of claim 14, wherein the said X in the chemical formula is selected from the group consisting of Cl$^-$, Br$^-$, I$^-$, NCS$^-$, CN$^-$, and NCO$^-$.

20. The perovskite solar cell of claim 15, wherein the manufacturing material of the electron blocking layer is selected from the group consisting of TPTPA, α-NPD, TPD, and CuPc.

* * * * *